United States Patent
De Boer et al.

(10) Patent No.: US 9,645,511 B2
(45) Date of Patent: May 9, 2017

(54) LITHOGRAPHY SYSTEM, METHOD OF CLAMPING AND WAFER TABLE

(71) Applicant: Mapper Lithography IP B.V., Delft (NL)

(72) Inventors: Guido De Boer, GP Someren (NL); Michel Pieter Dansberg, HP Berkel en Rodenrijs (NL); Pieter Kruit, EB Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 140 days.

(21) Appl. No.: 14/135,378

(22) Filed: Dec. 19, 2013

(65) Prior Publication Data
US 2014/0176920 A1 Jun. 26, 2014

Related U.S. Application Data

(62) Division of application No. 12/218,080, filed on Jul. 11, 2008, now Pat. No. 8,705,010.

(Continued)

(51) Int. Cl.
*G03B 27/58* (2006.01)
*G03F 7/20* (2006.01)

(52) U.S. Cl.
CPC .......... *G03F 7/70691* (2013.01); *G03F 7/707* (2013.01); *G03F 7/70783* (2013.01); *G03F 7/70875* (2013.01)

(58) Field of Classification Search
CPC .. G03F 7/70691; G03F 7/707; G03F 7/70783; G03F 7/70875; G03F 7/70308
See application file for complete search history.

(56) References Cited

U.S. PATENT DOCUMENTS 4,918,870 A 4/1990 Torbert
4,944,645 A 7/1990 Suzuki
(Continued)

FOREIGN PATENT DOCUMENTS

CN 1364679 8/2002
CN 1614511 A 5/2005
(Continued)

OTHER PUBLICATIONS

Tas, et al. The Institution of Electrical Engineers, Stevenage, GB, Tas, N.R. et al., "Capilarity induced negative pressure of water plugs in nanochannels", XP002502485, Database Accession No. (Aug. 19, 2003).

(Continued)

*Primary Examiner* — Deoram Persaud
(74) *Attorney, Agent, or Firm* — Blakely Sokoloff Taylor & Zafman LLP

(57) ABSTRACT

The invention relates to a lithography system, for example for projecting an image or an image pattern on to a target (1) such as a wafer, said target being included in said system by means of a target table (2), clamping means being present for clamping said target on said table. Said clamping means comprises a layer or stationary liquid (3), included at such thickness between target and target table that, provided the material of the liquid (C) and of the respective contacting faces (A, B) of the target (1) and target table (2), a pressure drop ($P_{Cap}$) arises.

14 Claims, 3 Drawing Sheets

Related U.S. Application Data

(60) Provisional application No. 60/959,531, filed on Jul. 13, 2007.

(56) References Cited

U.S. PATENT DOCUMENTS

| | | | |
|---|---|---|---|
| 7,158,211 | B2 | 1/2007 | Straaijer |
| 7,307,696 | B2 | 12/2007 | Ottens et al. |
| 2003/0082466 | A1 | 5/2003 | del Puerto et al. |
| 2004/0160582 | A1 | 8/2004 | Lof et al. |
| 2004/0227925 | A1 | 11/2004 | Sato |
| 2005/0046813 | A1* | 3/2005 | Streefkerk .......... G03F 7/70258 355/30 |
| 2005/0122503 | A1 | 6/2005 | Ottens et al. |
| 2005/0128463 | A1 | 6/2005 | Ottens et al. |
| 2005/0146694 | A1* | 7/2005 | Tokita .................... G03B 27/52 355/30 |
| 2005/0237501 | A1 | 10/2005 | Furukawa et al. |
| 2005/0259236 | A1 | 11/2005 | Straaijer |
| 2006/0017893 | A1 | 1/2006 | Mertens et al. |
| 2006/0033892 | A1* | 2/2006 | Cadee ................ G03F 7/70341 355/30 |
| 2006/0132733 | A1 | 6/2006 | Modderman |
| 2006/0139614 | A1 | 6/2006 | Owa et al. |
| 2006/0285096 | A1* | 12/2006 | Jacobs ................ G03F 7/70341 355/53 |
| 2007/0009649 | A1 | 1/2007 | Nakamura et al. |
| 2007/0177125 | A1 | 8/2007 | Shibazaki |
| 2007/0196774 | A1 | 8/2007 | Fujiwara et al. |
| 2007/0273856 | A1 | 11/2007 | Margeson |
| 2008/0043210 | A1 | 2/2008 | Shibuta |
| 2008/0106712 | A1 | 5/2008 | Nagasaka |
| 2008/0117391 | A1 | 5/2008 | Onvlee et al. |
| 2008/0129969 | A1* | 6/2008 | Peng ................... G03F 7/70875 355/30 |
| 2008/0202555 | A1 | 8/2008 | Shibazaki |
| 2008/0278695 | A1* | 11/2008 | Shirata ................ G03F 7/70341 355/30 |
| 2008/0284995 | A1 | 11/2008 | Ottens et al. |
| 2009/0027649 | A1 | 1/2009 | De Boer et al. |
| 2010/0238421 | A1 | 9/2010 | De Jong |
| 2010/0265486 | A1 | 10/2010 | De Jong et al. |

FOREIGN PATENT DOCUMENTS

| | | |
|---|---|---|
| CN | 1614513 A | 5/2005 |
| CN | 2726828 | 9/2005 |
| CN | 1684001 A | 10/2005 |
| CN | 1723541 A | 1/2006 |
| CN | 1839463 A | 9/2006 |
| CN | 1873914 | 12/2006 |
| EP | 1304727 | 4/2003 |
| EP | 1 493 838 A1 | 1/2005 |
| EP | 1586948 A1 | 4/2005 |
| EP | 1571695 A1 | 9/2005 |
| EP | 1610182 | 12/2005 |
| EP | 1280188 | 1/2007 |
| EP | 1791027 | 5/2007 |
| EP | 1923743 | 5/2008 |
| EP | 13 17 9130 | 9/2013 |
| EP | 13 17 9131 | 9/2013 |
| JP | 61-239624 | 10/1986 |
| JP | 05-183042 A | 7/1993 |
| JP | 5183042 | 7/1993 |
| JP | 07-017628 A | 1/1995 |
| JP | 7017628 | 1/1995 |
| JP | 2004-134538 A | 4/2004 |
| JP | 2004119716 | 4/2004 |
| JP | 2004363160 | 12/2004 |
| JP | 2005-109489 A | 4/2005 |
| JP | 2005-142570 A | 6/2005 |
| JP | 2006-310588 | 9/2006 |
| JP | 2010-533385 A | 10/2010 |
| JP | 5372928 | 9/2013 |
| JP | 2014-030038 A | 2/2014 |
| JP | 2014-039048 A | 2/2014 |
| KR | 10-2003-0084370 A | 11/2003 |
| KR | 10-2004-0102365 A | 12/2004 |
| TW | 561522 B | 11/2003 |
| TW | 200409700 A | 6/2004 |
| WO | WO 2004/033197 A2 | 4/2004 |

OTHER PUBLICATIONS

Office Action for Chinese Publication No. CN103456671 dated Jul. 16, 2015 (16 pages).

Office Action for Chinese Publication No. CN103456670 dated Jul. 21, 2015 (17 pages).

Chinese Office Action with English Language Translation, dated Apr. 8, 2016, Chinese Application No. 2013103789804.

Taiwanese Search Report with English Language Translation, dated Oct. 22, 2015, Taiwanese Application No. 102129451.

Notice of Allowance in U.S. Appl. No. 14/135,372 mailed Dec. 23, 2016. 13 pages.

* cited by examiner

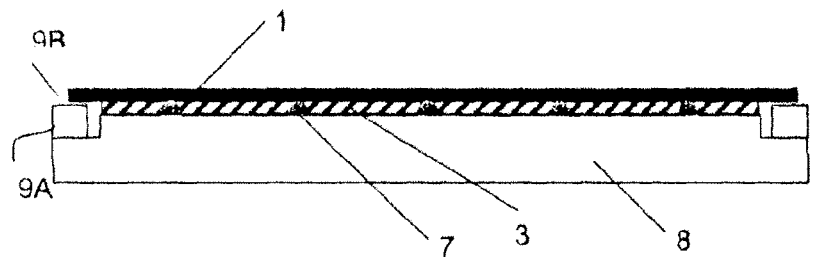
FIG. 4
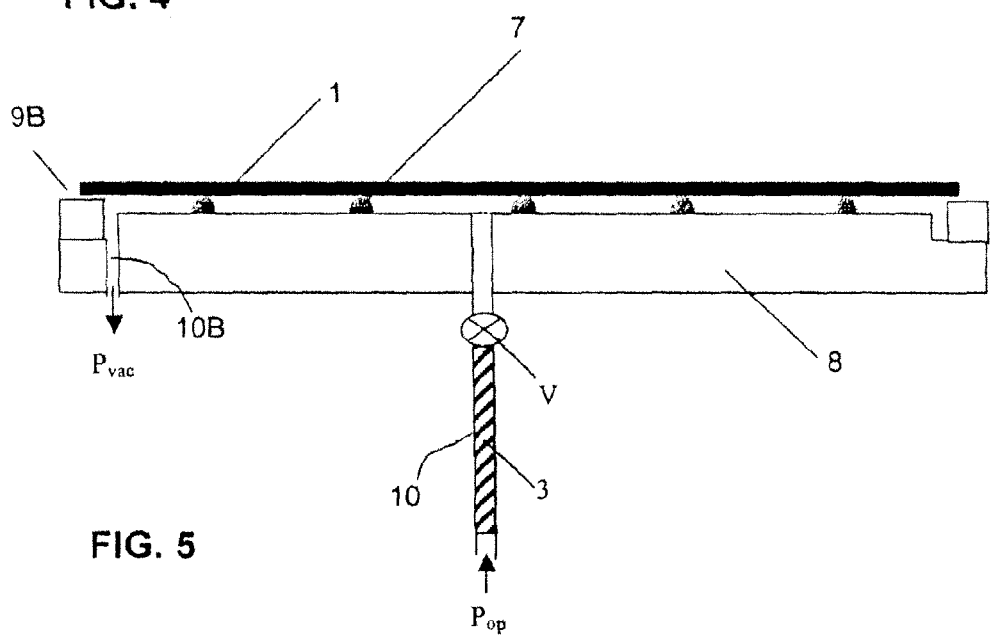
FIG. 5
FIG. 6
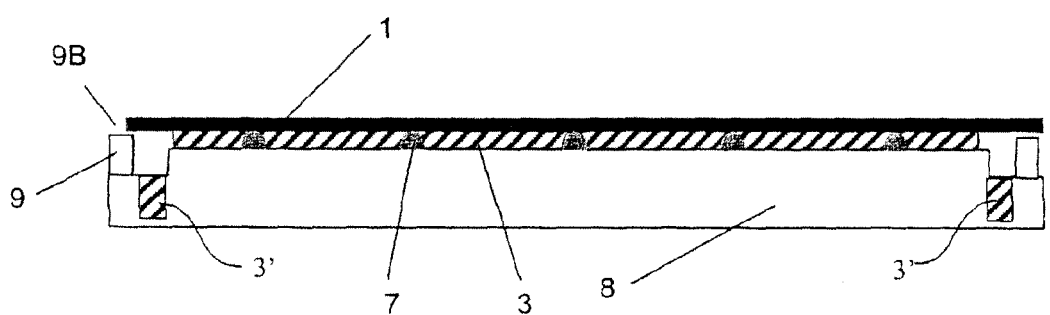

LITHOGRAPHY SYSTEM, METHOD OF CLAMPING AND WAFER TABLE

CROSS REFERENCE TO RELATED APPLICATION

The present patent application is a non-provisional application claiming the priority of a provisional application of Application No. 60/959,531, filed Jul. 13, 2001.

FIELD OF THE INVENTION

The present invention relates to a lithography system for projecting an image pattern on to a target surface such as a wafer.

Such systems are generally known, e.g. from WO 2004038500. En the example presented by the latter system, the target to be patterned is subjected to incidence of photons or charged particles such as ions and electrons. So as to realize high precision patterning of the target, it is to be firmly bonded or connected to a target table by means of which the target is moved rotative to the source of incidence, at least if position measurement of said target is performed via said target table. Such movement is performed at least in a direction essentially transversely tot a main direction of incidence. It is preferably also to remain in position relative to said table during handling of the target, e.g. during insertion and removal of the target to and from the position where it is to be processed, all be it that relative position of target and table could be measured as a final handling part. Moreover, such requirement should remain valid where insertion and removal is to be performed to and from vacuum environment. Various solutions exist for meeting the above requirements, e.g. by means of electromechanical clamping.

The position where the target, commonly a wafer, is processed in a modern lithography system is a target carrying means, commonly a chuck or a wafer table, here alternatively denoted as a reference to the target. Such reference, i.e. carrying means is shaped ultimately flat so as to support minimization positioning and/or focus errors during lithographic exposure of the target. To this end, in particular for taking away and/or preventing occurrence of bow and warp therein, the target is at least during exposure maintained in close contact to the reference by the exertion of a force thereon. In this manner the target is also maintained optimally within focus depth of the lithography system in which it is included. Commonly said force is realized as a pulling force, generated by electrostatic and or vacuum means acting on said target.

Such solutions however, may have the disadvantage of carrying tubes, cables and/or wiring with the table, thereby increasing the complexity of a required, highly refined positioning of said table relative to a projection means of the litho system. The disadvantage is also present in systems where the target is to be taken out and in integrally with the target table give the coupling and decoupling actions which are then to be performed on cabling, wiring and/or conduits.

Still further and important requirements too lithography system for patterning a target include the realization of flatness thereof, i.e. a requirement towards cancellation of wafer bow and warp, which is done by pulling the target to a reference. The means for performing this function are normally the same as or limited to those for performing the function of keeping the target in position on said table within an exposure field.

The means for maintaining said target in position and/or for pulling the same to a flat reference may be loaded by thermal expansion and contraction due to an energy load of a projection system of the system, as included for patterning said wafer.

Thus a further requirement to the known lithography systems is to realize a thermal conduction between target and target table, in practice so as to conduct heat from said target towards a heat dissipating part of the system. Such swift conduction and dissipation of heat limits positioning distortion by thermal expansion or contraction of the target. The latter is in particular important in modern lithography systems where is a quest for realizing high throughput, e.g. in terms of wafers per hour, the target is subjected to relatively high energy loads which normally translate into heat and which may cause said positioning distortion if not addressed.

Where heat dissipation may be addressed by heat dissipating means, the transport of heat induced to said target towards said heat dissipating means may still be a limiting factor in any solution towards heat dissipation. It is therefore a further object of the present invention to realize a method for clamping and a clamping means which optimally addresses the issue of heat conduction while remaining practical in use and while minimally if not totally net distorting a positioning function of the table or chuck carrying said target.

BACKGROUND

In general positioning of targets such as wafers on a chuck is known from machining processes, as in EP 0100648, JP7237066 and JP8064662, where wafers are frozen on to a chuck before machining the same. According to abstract of the tatter publication, a wafer is mounted to a wafer mounting face through a pure water layer having micro thickness. A disadvantage in respect of the required positioning precision in case of transfer of these known concepts to a lithography system, is the piping required for feeding refrigerant through the chuck.

The preceding disadvantage is illustrated in PCT/US01/26772, which discloses a wafer clamp in a lithography system. The clamp is also used for transport of heat induced by a charged particle beam on a target. The clamping and releasing of the target is in this device performed by applying "one or more" phase transitions to a clamping component that is applied between a wafer and a supporting structure. These phase transitions "facilitate various operations throughout the process" and "ensure that the wafer may be easily loaded and released from the structure. The clamping component is applied in a liquid or gaseous form, and brought into a solid state by active cooling of the support structure, so as to achieve a solid clamping of wafer to said structure. It is here concluded that such a manner of clamping can basically be denoted as gluing the wafer.

The above known clamping device for a lithography system is indicated to be "particularly useful in processes that require wafer cooling", in particular in vacuum due to a large contact area between component and wafer, and a high thermal conductivity of the clamping component. A disadvantage of this known system however, in addition to the required temperature changes in the support structure, is the plurality of conduits required for separately delivering the clamping component and a circulated chilled fluid to the target table.

US patent publication 2005/0186517 relates to a process for a lithography system, of attaching a wafer to a chuck aligning a wafer to a wafer stage and subsequently exposing the wafer. In particular it teaches to cause opposite stress against wafer expansion after an initial stress relieving expansion of a wafer chuck, thereby potentially doubling the amount of allowed heating of the wafer before undesired slip between wafer and chuck occurs. The attaching process is exemplified by a process using electrostatic clamping and by a process of using vacuum clamping, also requiring cabling and or conduits to a moveable table carrying said target.

Outside the vacuum environment encountered in the field of lithographic exposure of targets, it is from the technical area of wafer testing, known by EP patent application 511928 of 1991 en by presentation publication "Liquid interface at wafer test" presented at the SWTW 2005 conference on Jun. 4, 2005, known to integrate heat conduction and clamping of a wafer to a chuck by means of a flowing film of water. The principle conceived in this known device is to realise conduction of target induced heat through the film of water by maintaining the same at ultimately small thickness, however sufficiently large for levelling out roughness as typically encountered at wafer back-sides. Clamping is in this principle according to the first document realised by fluid transfer on the top side of a grooved, planar clamping section of a chuck. The later document, where the grooves seem to have been omitted form the clamping section, implicitly confirms this explanation by noting that heat is not carried away by fluid flow: "it is conducted through the fluid into the chuck". Moreover it indicates that a wafer is tightly pulled onto the film by means of a vacuum, which vacuum is applied to a Liquid film between chuck and wafer, at recovery locations in the chuck, peripheral to a wafer positioned on the chuck, the fluid thereby entering via a central opening.

It is impractical to carry over this concept known from the field of wafer testing to the field of wafer exposure, due to the vacuum circumstances at which lithographic exposure is performed in modern systems. However also for lithographic systems not performing under severe vacuum conditions, a disadvantage exists in that said flowing of water may be an undesired phenomenon in general, and in particular due to a risk of water leads becoming clogged by contaminations. In case of a required vacuum operation the known system fails due to a lack of over pressure at the top side of the target. Where the recovery openings require some amount of vacuum, or pressure below atmospheric for creating the flow of liquid, the central supply opening for the fluid pre-supposes a pressure higher than that at the recovery side. Should this system be entered into a vacuum environment, the target will tend to be lifted from its position rather than that it will tend to be clamped.

SUMMARY OF THE INVENTION

The present invention now, seeks to realise a clamping system for contemporary lithography systems, i.e. with highly refined pixel resolutions and highly refined accurately at relative positioning of target and source. Constraints herewith encompass a vacuum operable system and optimal heat conduction from an exposed target to a target carrying means or chuck. In realising such, the invention proposes to use a stationary liquid film, capillary included between said carrying means and said target for performing both said heat conduction function and a clamping function by the same liquid means.

With the novel solution cables or conduits and the like leading from "fixed" world to a moveable target carrying means are entirety obviated, thereby considerably if not totally reducing negative effect thereof on positioning accuracy of the carrying means.

The present invention surprisingly departs from an idea that strong pulling forces may be exerted to liquids like water if the conditions thereto are set properly, as is in very general wording set out in the article "The Physics of negative pressure", published by Discover on Mar. 27, 2003. It was conceived that in the case of lithography systems, such settings could be reached if a liquid was maintained stationary capillary manner between the surfaces of a target of wafer and a target carrying in or chuck, which surfaces are for obvious reasons normally maintained as flat as possible.

At such capillary inclusion of liquid, in fact a liquid volume between two plates or plate like structures as in the present lithography application, adhesion of the Liquid to the surfaces et the plates causes a circumferentially extending liquid surface, concavely extending between said two plates. This concave liquid surface tends to maintain its shape, even if tension is applied by pulling the plates apart, implying that negative tension occurs with the capillary included liquid volume.

It was further realised by the invention that with said capillary inclusion, the liquid layer is of such small magnitude that boiling of the liquid, e.g. water, can not occur, even when the liquid is at negative pressure. This phenomenon is also of practical value at heat conduction. Thus it was conceived that a liquid at negative pressure may be applied for providing the force required for pulling a target or wafer to a flat reference. In other words, a liquid in a small gap, as between plates formed by said reference and said target, exerts a force on the plates constructing the gap. This force, which apart from the height of the gap depends on the material properties of liquid and plates, is applied for realising the force for maintaining a target and a target table integral.

Although such novel concept the pressure inside the fluid is below zero, implying that there is tension in the liquid, it was realized that the liquid will not cavitate, i.e. will not boil, when the height of the in between target and reference is made smaller than the critical radius of a vapour bubble at accompanying liquid pressure. It was thus realised that also in this respect, the impossibility of a liquid like water to boil when in the described stationary capillary inclusion, a liquid may generate a considerable clamping force, sufficient for lithographic application.

It may be evident that the presently invented principle may be set bath practice in various manners.

BRIEF DESCRIPTION OF THE DRAWINGS

The invention will be further elucidated by way off example in the following embodiment of a mask-Less lithography system according to the current invention, in which:

FIGS. 3 and 4, are schematic illustrations of implementations of the idea underlying the present invention;

FIG. 5 is a schematic illustration of a first manner of introducing liquid in the capillary gap between table and target;

FIG. 6 by the provision of a circumferential gutter schematically illustrates a measure for minimising evaporation of liquid from the capillary gap;

In the figures, corresponding structural features, i.e. at least functionally, are referred to by identical reference numbers.

DETAILED DESCRIPTION OF THE INVENTION

Figure 1:
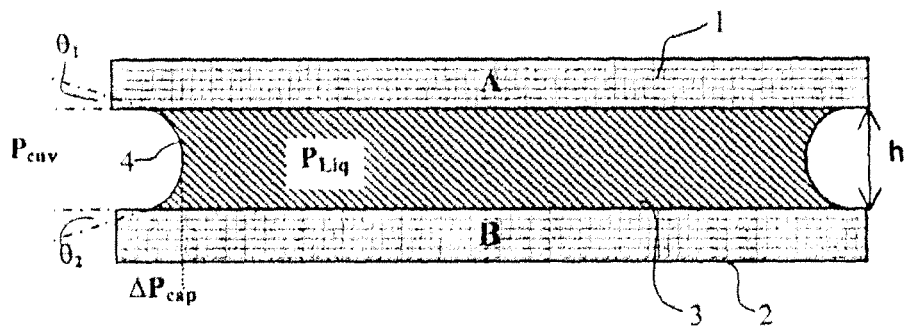
FIG. 1 in sectional view schematically illustrates a liquid, capillary included between two plate like structures, i.e. surfaces of materials A and B.

FIG. 1 shows a lithography target, here in the form of a wafer 1, which normally moves relative to e.g. a charged particle beam column of a litho apparatus, or other kind of beam source for lithography, by means of an actuated target fable or chuck, not indicated in this drawing. Between a top side of such it table 2 and said target 1, a volume of liquid 3 in included capillary. To this end the target 1 and top surface 2 have a mutual nominal distance of gap height h. The volume of liquid, according to the invention preferably water, is such that the radius of the target, as taken in top view, is virtually met by a radius R of the capillary included liquid 3. In any case, the radius of an incircle of the target is at least met by the radius of an excircle fitting the volume of liquid within the boundary of the target. In fact, the liquid is to remain, preferably only with a small distance thereto, within the boundaries of the target. The thus included liquid 3 forms a liquid surface 4, alternatively denoted fluid interface 4 at it's outer periphery which, as taken in the section according to FIG. 1, is generally concavely shaped, due to adhesive connection of the liquid to the target 1 and the top side 2 of a target table respectively. This concave surface 4 tends to maintain its shape at pulling the target and target table apart, and depends on pressure differential. The concaveness of the interface 4 depends on respective contact angles $\theta_1$ and $\theta_2$, which in turn depend on the material of table 2, and target 1, in this case material A and material B respectively.

In FIG. 1, the capillary pressure $\Delta P_{cap}$ is the pressure drop over the fluid interface 4 at the edge of the volume of liquid 3. The capillary pressure may according to yet further insight underlying the invention defined by a simplified equation:

$$\Delta P_{capillary} = \frac{-\gamma_{liquid}(\cos(\theta_1) + \cos(\theta_2))}{h} \quad (1)$$

In which $\gamma_{liquid}$ is the surface tension of the liquid in [N/m] and in which the contact angles $\theta_1$ and $\theta_2$ are the angles at which the liquid/vapor interface 4 meets the materials A and B respectively. The contact angle is amongst others, however significantly if not predominantly determined by material properties of the liquid 3 and the solid material A and B at the location of interface 4. In the same respect also the following equations holds:

$$P_{env} + \Delta P_{cap} = P_{liq} \quad (2)$$

With
$P_{env}$=environmental pressure
$\Delta P_{cap}$=capillary pressure at interface 4
$P_{liquid}$=pressure in liquid 3

Combining equations (1) and (2) it may be seen that $$\text{If } -\Delta P_{cap} > P_{env}, \text{ than } P_{liquid} < 0 \text{ bar} \quad (3)$$

The latter situation arises when $P_{env}$ approximates 0 bar, or under atmospheric pressure when $|\Delta P_{cap}| \geq 1$ bar. Because $P_{liq}<0$ bar this means that the pressure inside the liquid is negative. It is further recognised that in case $P_{liq}$ is smaller then the vapor pressure of the liquid, then fluid 3 might start to boil or cavitate. Boiling of fluid 3 is however prevented by making the height of the gap smaller then a critical radius of the bubbles.

Figure 2:
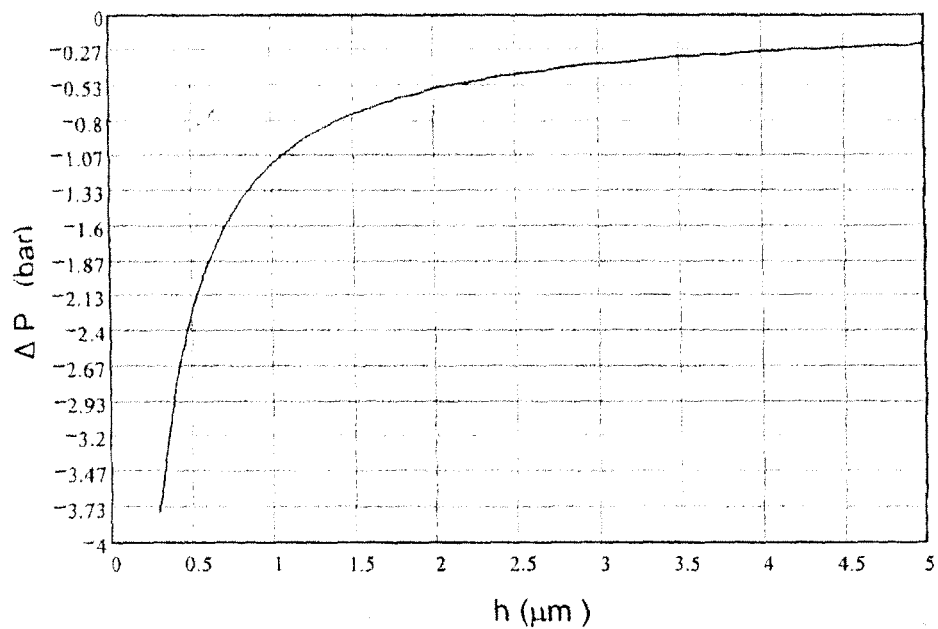
FIG. 2 is a graphical illustration of the relation of capillary pressure drop for a fused silica optical flat and a silicon wafer, with gap height between such plates capillary including water.

FIG. 2 illustrates the capillary pressure drop, which is taken as indicative for an amount of force that can be exerted, at pulling apart the plates having included a fluid, in casu water, as described above. The depicted curve is derived from a calculation involving two plates, i.e. contacting faces and water, one being a silicon wafer, and the other a fused silica optical flat. The validity of the curve has been tested on the basis of calculations and measurements involving it plates instead of SiO2. The present curve, it compares to that of glass and water, indicates that sufficient pulling power can be developed at gap heights as et nominally 10 μm and below, which, even at nominal heights of 5 μm is well in reach of regular lithographic applications. A particularly interesting range exists below a gap height of around 1 μm and below, since at this gap height title pressure drop is more than 1 bar, implying that negative pressure in the gap liquid already occurs at atmospheric pressure. However, already the pressure drop of near 0.2 bar, occurring at gap height of 10 μm is sufficient for such clamping that safe handling of a wafer table with placed wafer, e.g. at insertion into vacuum, is guaranteed.

Figure 3:
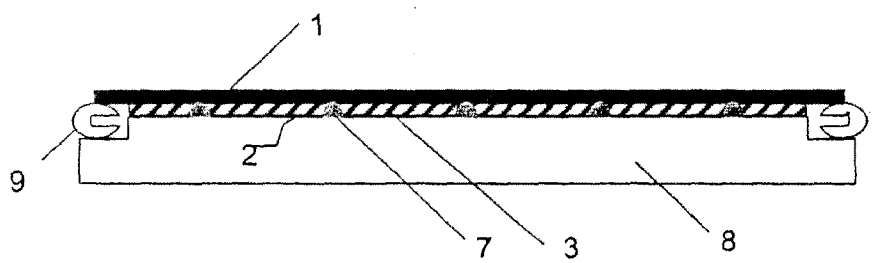

FIG. 3 illustrates a practical elaboration on the invented principle and schematically shows part of a lithographic system, including a target 1 embodied by a wafer, a top side 2 of a wafer table 8 or chuck part, a liquid 3 in the form of water, and an called viton or rubber O-rings 9. The O-rings 9 seal off liquid vapour evaporating from the gap containing liquid 3 by being inserted in a rim part of reduced height of the water table 8. By this measure the top side of the O-ring is set to a level corresponding in height to that of, and preferably being slightly higher than that of burls 7 on the top side of wafer table 8. Being provided with an incision at a radial side, in this example the radial inward turned side, the O-ring may be compressed between table and wafer without undue force requirement, however sufficient for preventing leakage of vapour, which is especially an issue in the vacuum environment in which such lithography means may be applied. In fact the O-ring, which is here of a thickness in the range from 0 to 5 mm diameter, thus form a C-ring, implying that the pressure required for compressing the O-ring is kept minimal. Some radial distance is kept between the O-ring and the central, raised table part of the target carrying means 8, so as to allow for openings, not depicted here, such as recovery openings for the fluid 3 applied in between. Preferably an O-ring or kind-like elastically deformable means is applied circumferentially around the target. In this manner larger forces may be applied between target and elastically deformable means, which allows the use of elastically deformable means with higher roughness, which is easier to get hands on, and relatively economic at purchase.

Alternatively, as in FIG. 4, leakage of vapour is prevented by a vapour limiting ring 9A, supported by an outer rim of the table, largely closing off the circumferential opening of the liquid nap, by leaving a very small vertical distance 9B between ring 9A, and target 1, supported by the burls 7 of the table. In particular this may be 10 to 20 times smaller than the gap height between target and target table.

Further to the set up according to the present invention, use is made of the principle that liquid at a pressure below its vapour pressure is or can be in a metastable state. Notice is taken that there is a critical radius for cavities beyond which such cavities grow unlimited. When now the smallest or of the liquid containing volume, as in accordance with preferred embodiment of the invention, is made very small in relative to, or even smaller then this critical radius, cavitation will not occur. When the pressure drop is from the Laplace-pressure, the critical radius is approximately twice the gap height or more. The height depends on the material properties between liquid and solid surface (contact angle).

The invention may further encompass the presence of one or more openings that can be closed for entry of fluid, which may be gas, and opened for release of fluid in said wafer table, thereby enabling release of a target from the table. A volumetrically highly precise fluid entry tube is provided preferably centrally. The invention may also include a pressing means for initially pressing the target into firm contact with said target table, i.e. with a multiplicity of burls 7 thereon. One embodiment for such pressing means involves a high pressure directed perpendicular towards the top side of the target 1, thereby eliminating any bow of the target and allowing the capillary action to be installed. One favourable manner of realising such pressure in accordance with a further aspect of the present invention is to direct a stream of fluidal means such as wind and water on to said target.

FIG. 5 illustrates a preferred manner of operation in which initial clamping alternatively denoted chucking, i.e. removing bow in the target is removed and in which liquid is introduced between target and table in a more or less combined manner. To this end a central entry channel 10 is provided in said target table, provided with a valve V. The wafer is chucked to the wafer table by a vacuum force generated by a vacuum pressure $P_{vac}$, applied via a plurality of circumferentially present openings 10B. When the wafer is correctly chucked to the wafer table the valve V is opened and the liquid will be sucked into the gap between the wafer and the wafer table. The filling speed of the water that flows into the gap is determined by the sum of the capillary pressure $P_{cap}$ and the pressure difference between the prevailing vacuum pressure $P_{vac}$ and an overpressure $P_{op.}$ and present or applied at the entry of channel 10, i.e. at a non-illustrated fluid source. Overpressure $P_{op.}$ is defined to be higher than the pressure $P_{env}$ prevailing over the target. It is for practical reasons limited to 1 bar, so as not to disturb the position of the target on the table, and the effective liquid pressure $P_{liq}$ is calculated with.

FIG. 6 illustrates a manner of preventing, at least further minimising evaporation of liquid from the capillary gap, i.e. from between target and target table. Circumferentially to the target, in the target table, and within the area sealed by elastic deformable means 9, or minimal gap 9B, a gutter of significantly larger width than the capillary gap height is made for containing non capillary included liquid 3'. Preferably the fluid 3' is of the same type as the capillary included fluid 3. It is however provided with a significantly larger surface or interface area. Although this gutter could be filled using the liquid source with pressure $P_{op.}$ for channel 10, be it via a separate lead and valve, preferably separate filling means are provided, i.e. independent from the supply of capillary included fluid. The filling means may be any independent filling means, e.g. including a separate liquid source, dedicated leads and valve towards said gutter, and/or a fluid pump.

Figure 7:
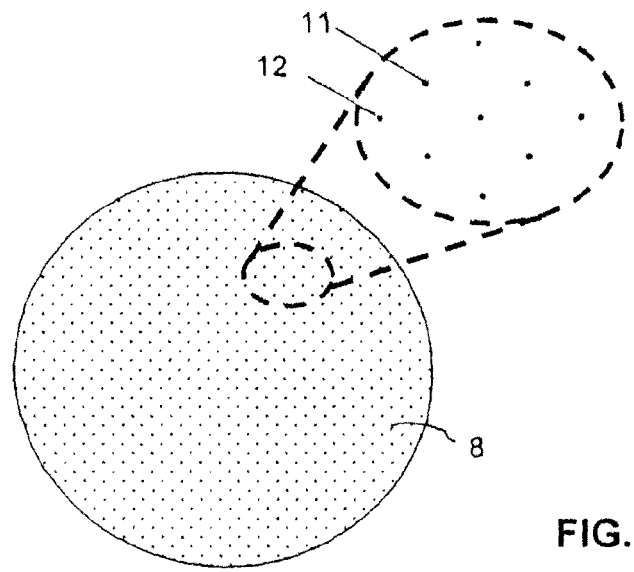
FIG. 7 is a figurative illustration of a manner of realising a liquid layer between target and target table.

FIG. 7 figuratively illustrates an alternative manner of introducing said capillary layer. Rather than entering fluid via a central opening as in the first embodiment example, the fluid is here entered to either one or both surfaces of table and target by depositing droplets 11, e.g. by spraying. Preferably however the deposition in a controlled manner so as to achieve evenly distributed. Liquid parts, e.g. by placing droplets by means of a droplet dispensing means, for example having one or more droplet dispensing mouths at predefined locations. In these manners of deposition a swift distribution of liquid is achieved, enhancing the practicability of the present new clamping method and means therefore. In the present example droplets are deposited on the target table 8. In this embodiment various openings 12 for prevention of air inclusion are distributed in a pre-defined manner, preferably generally evenly distributed, over the area of the target table.

Apart tram above said openings, the surface of the target table is defined by the presence of burls 7, which burls are for the sake of withstanding the clamping force of the capillary liquid included with an increased density of distribution. In this manner an attracted target may remain flat, i.e. will not bow between the burls under the force of the capillary fluid.

As a specific measure, one or both of the contacting surfaces of target and table may be surface treated, or coated with a material for influencing a contacting angle between the liquid and the relevant contacting surface, in particular towards a desired clamping pressure, more in particular at operating conditions, i.e. in vacuum. In practice, given a current standard for targets in case of wafers, only the target table will be coated. So as to still influence the capillary pressure drop in the clamp according to the present invention, it is conceived to adapt the burl height to a specific, desired pressure drop, given the conditions of liquid material, target and target table contacting face material. Such adaptation may for instance be made to meet a minimum desired clamping force and to adapt to a specific combination of clamping force and distribution or mutual distance of burls, in particular to prevent local bow of the target between the burls, given a clamping pressure and resulting force on the target. A minimum burl height is hereby taken into account, while it is also considered that burl density may be adapted, for instance it may be in to meet minimum required clamping force. Said minimum burl height is considered in respect of a measure to accommodate dust or other contaminating particles between the it and within the gap height. The latter of course within the constraint of a measure according to the invention of maintaining the gap height to such minimum that boiling of the fluid in between cannot occur.

Figure 8:
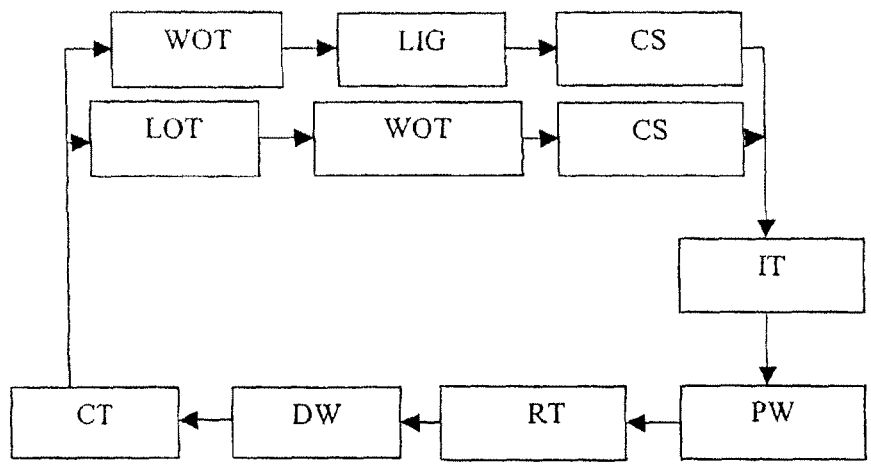
FIG. 8 is a process flow for a lithographic system, at least part thereof according to the present invention.

FIG. 8 illustrates a relevant part of a process flow for a lithographic apparatus or system improved with the present invention, where the target is formed by a wafer. The process part departs from the action and status of clean wafer table CT, indicated in the Lower left corner. From there two alternative process paths may be followed. The first and above illustrated path part is characterised by first step WOT of placing a wafer on the target table, second step LIG of liquid flow into the gap between table and wafer through conduits in the table, and third step CS of sealing the conduits for water, i.e. Liquid supply and air inclusion removal. The second possibility of implementing a process in accordance with the invention is indicated by the lower branch, showing the steps of first applying liquid on the table LOT, placing a wafer on the table WOT, and conduit sealing CS, which in this case merely encompasses sealing the air inclusion discharge. Such sealing is preferably performed in a central discharge or supply conduit which is linked to the table surface via multiple branches.

In a subsequent step IT the table and wafer are inserted in a part of the litho system which is to be brought to vacuum, the wafer is processed in step PW, table and wafer are removed from the apparatus in step RT, the wafer is detached from the table in step DW amongst others by removing or opening any conduit seal, and the wafer table is cleaned.

In case of liquid application LIG, water is applied by at least one, but alternatively also a multitude of water conduits through which the water is supplied to the gap. In accordance with a further aspect of this invention, filling of the gap is performed by relying on a sufficiently large capillary pressure for allowing water, or any other relevant liquid, to pull itself into the gap. In a further embodiment this process is improved, i.e. made faster by using external pressure to increase the pressure during filling. In yet a further elaboration of the invention, also the air inclusion openings are used to supply a lower pressure.

In case of water application LOT on table, application of wafer is performed by applying small evenly distributed droplets on the surface of the wafer table or wafer. When the wafer is placed on the wafer table the droplets will spread due to capillary action. This process can be aided by suction through opening holes. In case of sealing conduits CS, all holes that are used for filling of the gap have to be sealed after application of the Liquid so as to prevent evaporation when the combination of wafer table and wafer are in vacuum. In case of detaching a wafer from the table in process step DW, the openings that are used to supply water and/or prevent air inclusions are also used to apply air pressure and, in yet a further elaboration of the invention the wafer is blown off from the table. The air pressure is in this case applied at least fairly evenly distributed so that the wafer will not brake.

It is also considered that the smaller the gap, the larger the pressure drop that is required to keep flowing speed equal. Such increase in required pressure drop is more then the pressure increase from the capillary pressure available from smaller gaps. Therefore flow by capillary pressure is slower for smaller gaps, in fact gaps beyond a critical gap height given certain conditions including liquid material and contacting face material. At very small gaps an electro-viscous effect increases the apparent viscosity of water, as may per se be known from 'capillary filling speeds of water in nano channels'.

Burls are required to reduce the influence of contamination by particles on the backside of the wafer. The maximum pitch of the burls is determined by deflection of the wafer in between the burls caused by the capillary pressure. A typical value for the pitch of the burls is 3 {mm}. The height of the burl determines the gap, and is in accordance with the invention used for regulating clamping pressure given other system conditions such as materials and dimensions and vice versa. The surface per burl is made sufficient so as not to deform or brake under capillary pressure. The diameter per burl is approximately 25 m or more. It is preferred that burls are shaped generally rounded, i.e. without edges, to reduce the possibility of particulate contamination during cleaning. These are particles from a tissue during wiping of the table.

Figure 9:
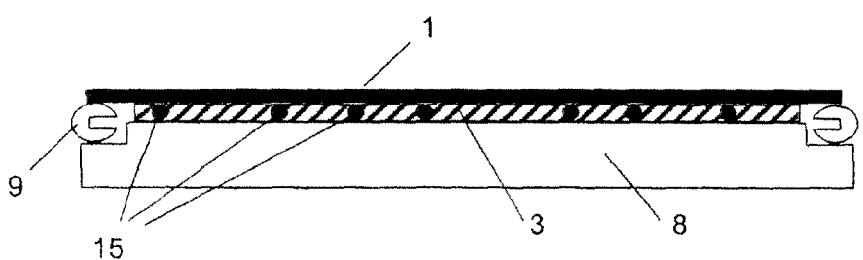
FIG. 9 is a schematic illustration of the use of spacers.

In addition to or in stead of using burls 7, spacers 15 (glass grains, SiO2 grains, etc.) are dispersed uniformly over the carrying means 8 as shown in FIG. 9, for example by being sprayed from over the carrying means 8 or by applying a dispersed solution of the spacers 15, thus providing spacers 15. In an embodiment, the spacers 15 are dispersed in the liquid 3 which ultimately forms the layer of stationary liquid.

Apart from the concepts and all pertaining details as described in the preceding, the invention relates to all features as defined in the following set of claims as well as to all details as may directly and unambiguously be derived by one skilled in the attached figures. In the following set of claims, rather than fixating the meaning of a preceding term, any reference numbers corresponding to structures in the figures are for reason of support at reading the claim, included solely for indicating an exemplary meaning of a preceding term and are thus included between brackets.

A lithography system, for example for projecting an image or an image pattern on to a target (1) such as a wafer, said target being included in said system by means of a target table (2), clamping means being present for clamping said target en said table, wherein said clamping means comprises a layer of stationary liquid (3), included at such thickness between target and target table that, provided the material of the liquid (C) and of the respective contacting faces (A, B) of the target (1) and target table (2), a pressure drop ($P_{cap}$) arises.

In an embodiment, the pressure drop results in a pressure ($P_{liq}$) in said volume of liquid, which is below its vapour pressure.

In an embodiment, the pressure drop is realized in vacuum.

In an embodiment, a pressure ($P_{env}$) arises, which is significantly lower than an actual environmental pressure ($P_{env}$) for said layer (3).

In an embodiment, the inclusion is arranged such that said lower pressure ($P_{Liq}$) realizes a negative pressure at vacuum condition, in particular at typical lithographic vacuum condition.

In an embodiment, the wafer table is provided with spacers (7, 15) for defining the thickness of the layer of stationary liquid (3).

In an embodiment, the wafer table is provided with burls, and the liquid (3) is maintained at a capillary condition ($P_{cap}$) by means of a predefined burl height, i.e., gap height between target table and target, maintained at such minimal level that given the clamping conditions, the liquid (3) is prevented from a possibility to boil, i.e., from a possibility to cavitate.

In an embodiment, the capillary condition is realized by maintaining a nominal mutual distance of between 0, 1 and 10 μm between target (1) and target table (8).

In an embodiment, the circumferential sealing means such as 0-rings are included, in particular for preventing liquid from vaporization.

In an embodiment, the sealing means is composed as an elastically deformable means, in particular having a generally C-shaped form as taken in cross section.

In an embodiment, the 0-ring or sort means is included circumferentially around said target.

In an embodiment, the sealing means is composed of an 0-ring provided with circumferentially extending, slotted cut out, open to a radial side of the ring, in particular to the radial inner side, and extending over a substantial part of the diameter of the ring, in particular up to around the center of the 0-ring.

In an embodiment, the circumferential sealing means is composed as a circumferential air gap (9B) between target table (8) and target of a height equal or smaller than the height realized for maintaining said capillary condition.

In an embodiment, the wafer table is provided with a gutter for containing fluid, the gutter being of a width significantly larger than the height of the gap, and located circumferential to a target carrying part of the target table, within the circumference defined by said sealing means for sealing said capillary included liquid between said target and said target table.

In an embodiment, the table is provided with closeable discharge openings, in particular for release of air, at least gaseous material at entry of capillary liquid, in particular centrally closable.

In an embodiment, the openings are included in a recessed circumferential rim of said table, preferably circumferentially to a water carrying part of said wafer table, i.e., comprising chucks, in particular within the circumference defined by said sealing means.

In an embodiment, the discharge openings are included generally evenly spread over the surface of said table.

In an embodiment, the clamping liquid is composed of water.

In an embodiment, the table is provided with at least one preferably centrally closeable entry opening, in particular for entry of capillary liquid.

In an embodiment, entry of fluid is realized by spread application of liquid on to either one contact face of table and target.

In an embodiment, the liquid is deposited in a controlled manner by means of a liquid depositing means releasing controlled volumes of liquid drops or lines on the table surface.

In an embodiment, liquid is deposited by a precise depositing means comprising a plurality of depositing mouths.

In an embodiment, the density of burls on the contacting face of said table is determined by a nominal pitch value within the range of 1 to 3 mm.

In an embodiment, at least one of either mutual contacting face of target and table is provided with a coating of different material than of said face base.

In an embodiment, initial pressure means are provided for realizing an initial firm contact between target and table.

In a embodiment, an initial pressure means is realized by means of one or more e.g., centrally provided openings comprising a valve in a supply channel, connected to such opening, either in a channel central to all such openings or in each separate channel, which valve is closed in advance of providing fluid to the gap between target and target table, and which gap is exposed to vacuum pressure via further openings, circumferential, to a wafer carrying part of said wafer table.

In an embodiment, initial pressure means comprises a pump such as a water pump and an air pump or blower, in particular for realizing a first contact between target and table by urging a stream of flowing material on to said target, in particular one of air and water.

In an embodiment, the target table is adapted for loose inclusion, i.e., without connection of conduits in a lithographic apparatus for treating a target carried by the table.

In an embodiment, a wafer table for insertion into a vacuum environment, such as in a lithographic apparatus, is provided with clamping means adapted to the use of a stationary layer of liquid, for clamping a target such as a wafer.

In an embodiment, the clamping are adapted to realize said clamping outside the vacuum space of a lithographic apparatus, in particular before insertion thereof into the vacuum compartment of a lithographic apparatus for treating a target carried by said target table.

In an embodiment, clamping an object having a generally flat contacting face to another object also having a generally flat contacting face is provided, wherein for the purpose of mutual clamping of said objects a layer of stationary held liquid is maintained capillary between said faces.

In an embodiment, the objects are part of a vacuum operable lithographic system.

In an embodiment, the two objects are pressed to one another, in particular by an air stream, in order to allow installment of said capillary inclusion as a clamping means.

In an embodiment, the wafer table is taken out of the lithography system for replacing a target thereon.

In an embodiment, a wafer table in a lithographic apparatus is exchanged with another one for the purpose of exchanging a target in said lithographic apparatus.

In an embodiment, the target table is treated outside a lithographic apparatus, in which treatment the temperature thereof is conditioned.

The invention claimed is:

1. Method of exchanging a wafer (1) in a lithography apparatus, wherein said lithography apparatus is adapted for projecting an image or an image pattern on said wafer when said wafer is in a vacuum part of the lithography apparatus which part has operating conditions at a vacuum, said method comprising:
   a step of placing said wafer (1) on a wafer table (8), said step comprising clamping said wafer (1) on said wafer table (8) outside of said lithography apparatus,
   a subsequent step (IT) of inserting said wafer table (8) and said wafer (1) in said lithography apparatus,
   a step (PW) of processing said wafer (1) by projecting said image or image pattern on said wafer when said wafer is in said vacuum part of said lithography apparatus,
   a step (RT) of removing said wafer table (8) and said wafer (1) from the lithography apparatus,
   a step (DW) of detaching said wafer (1) from said wafer table (8), and
   a step of exchanging said wafer table (8) with another one for the purpose of exchanging the wafer (1) in said lithography apparatus, and
   a step of treating said wafer table (8) outside said lithography apparatus, in which treatment the temperature of said wafer table (8) is conditioned.

2. Method according to claim 1, further comprising a step of cleaning said wafer table (8) subsequent to said step (DW) of detaching said wafer from said wafer table or prior to said step of placing said wafer on a wafer table.

3. Method according to claim 1, wherein said wafer table (8) is adapted for loose inclusion in said lithography apparatus.

4. Method according to claim 1, wherein for the purpose of mutual clamping of said wafer (1) to said wafer table (8), a layer of stationary held liquid (3) is maintained between said wafer (1) and said wafer table (8).

5. Method according to claim 4, comprising a step of detaching said wafer (1) from said wafer table (8) by amongst others opening a conduit seal.

6. Method according to claim 4, further comprising the step of applying a liquid on the wafer table (8), before said step of placing said wafer (1) on a wafer table (8), wherein said liquid is included as said layer of stationary held liquid (3) when said wafer (1) is placed on said wafer table (8).

7. Method according to claim 4, wherein a capillary condition of said layer of stationary held liquid (3) is realized by maintaining a nominal mutual distance of between 0.1 and 10 μm between said wafer (1) and said wafer table (8).

8. Method according to claim 4 or 7, wherein circumferential sealing means are included in said wafer table for preventing said liquid from vaporization.

9. Method according to claim 8, wherein the circumferential sealing means is composed as a circumferential air gap (9B) between said wafer table (8) and said wafer (1).

10. Method according to claim 9, wherein the wafer table (8) is provided with a gutter for containing a liquid, the gutter being of a width significantly larger than said height of the burls (7), and located circumferential to a wafer carrying part (2) of the wafer table (8), within the circumference defined by said sealing means for sealing said included liquid between said wafer (1) and said wafer table (8).

11. Method according to claim 4, wherein the wafer table (1) is provided with burls (7) having a height for defining a thickness of the layer of stationary held liquid (3).

12. Method according to claim 4, wherein said layer of stationary liquid (3) is composed of water.

13. Method according to claim 1, wherein said wafer table (8) is provided with discharge openings.

14. Method according to claim 1, wherein the wafer table is taken out of the lithography apparatus for replacing a wafer thereon.

\* \* \* \* \*